United States Patent
Lin et al.

(10) Patent No.: US 8,551,837 B2
(45) Date of Patent: *Oct. 8, 2013

(54) METHODS OF FABRICATING HIGH-K METAL GATE DEVICES

(75) Inventors: Yih-Ann Lin, Jhudong Township, Hsinchu County (TW); Ryan Chia-Jen Chen, Chiayi (TW); Chien-Hao Chen, Chuangwei Township, Ilan County (TW); Kuo-Tai Huang, Hsinchu (TW); Yi-Hsing Chen, Chuanghua (TW); Jr Jung Lin, Wurih Township, Taichung County (TW); Yu Chao Lin, Rende Township, Tainan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/408,016

(22) Filed: Feb. 29, 2012

(65) Prior Publication Data

US 2012/0164822 A1 Jun. 28, 2012

Related U.S. Application Data

(62) Division of application No. 12/405,965, filed on Mar. 17, 2009, now Pat. No. 8,148,249.

(60) Provisional application No. 61/096,590, filed on Sep. 12, 2008.

(51) Int. Cl.
*H01L 21/8242* (2006.01)

(52) U.S. Cl.
USPC ..... 438/240; 438/310; 438/704; 257/E21.197

(58) Field of Classification Search
USPC .................. 438/240, 310, 704; 257/E21.197
See application file for complete search history.

(56) References Cited

U.S. PATENT DOCUMENTS

| | | | | |
|---|---|---|---|---|
| 4,053,335 | A * | 10/1977 | Hu ............................... | 438/143 |
| 5,360,748 | A * | 11/1994 | Nadahara et al. ............. | 438/476 |
| 5,407,847 | A * | 4/1995 | Hayden et al. ................ | 438/305 |
| 5,976,991 | A * | 11/1999 | Laxman et al. ............... | 438/786 |
| 6,455,330 | B1 | 9/2002 | Yao et al. | |
| 6,696,345 | B2 | 2/2004 | Chau et al. | |
| 6,710,407 | B2 | 3/2004 | Yamamoto | |
| 7,023,064 | B2 | 4/2006 | Park et al. | |
| 7,071,066 | B2 | 7/2006 | Wang et al. | |
| 7,109,104 | B2 | 9/2006 | Ku et al. | |
| 7,820,552 | B2 * | 10/2010 | Kanakasabapathy et al. ............................. | 438/704 |
| 8,148,249 | B2 * | 4/2012 | Lin et al. ....................... | 438/591 |
| 2002/0043683 | A1 | 4/2002 | Nakagawa et al. | |
| 2008/0026492 | A1 | 1/2008 | Richter et al. | |
| 2008/0132072 | A1 | 6/2008 | Letz et al. | |

* cited by examiner

*Primary Examiner* — Jarrett Stark
*Assistant Examiner* — Nicholas Tobergte
(74) *Attorney, Agent, or Firm* — Haynes and Boone, LLP

(57) ABSTRACT

Methods of fabricating semiconductor devices with high-k/metal gate features are disclosed. In some instances, methods of fabricating semiconductor devices with high-k/metal gate features are disclosed that prevent or reduce high-k/metal gate contamination of non-high-k/metal gate wafers and production tools. In some embodiments, the method comprises forming an interfacial layer over a semiconductor substrate on a front side of the substrate; forming a high-k dielectric layer and a capping layer over the interfacial layer; forming a metal layer over the high-k and capping layers; forming a polysilicon layer over the metal layer; and forming a dielectric layer over the semiconductor substrate on a back side of the substrate.

20 Claims, 10 Drawing Sheets

METHODS OF FABRICATING HIGH-K METAL GATE DEVICES

PRIORITY DATA

This patent claims priority to, and is also a divisional of, Ser. No. 12/405,965 filed on Mar. 17, 2009 now U.S. Pat. No. 8,148,249, entitled "METHODS OF MANUFACTURING METAL-SILICDE FEATURES," the entire disclosure of which is incorporated herein by reference. Ser. No. 12/405,965 claims priority to provisional Ser. No. 61/096,590 filed on Sep. 12, 2008, entitled "METHODS OF FABRICATING HIGH-K METAL GATE DEVICES," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when integrating high-k/metal gate features into a CMOS process flow. For example, the high-k/metal gate features can contaminate the tools of the production line resulting in defects in both high-k/metal gate wafers and non-high-k/metal gate wafers.

SUMMARY

The present disclosure describes a method for fabricating a semiconductor device. In one embodiment, the method includes forming an interfacial layer over a semiconductor substrate on a front side of the substrate; forming a high-k dielectric layer over the interfacial layer; forming a capping layer over the high-k dielectric layer; forming a metal layer over the capping layer; forming a first polysilicon layer over the metal layer; and forming a second polysilicon layer over the semiconductor substrate on a back side of the substrate.

In another embodiment, the method includes forming an interfacial layer over a semiconductor substrate on a front side of the substrate; forming a high-k dielectric layer over the interfacial layer; forming a capping layer over the high-k dielectric layer; forming a metal layer over the capping layer; forming a polysilicon layer over the metal layer; forming a first hardmask layer over the polysilicon layer; and forming a second hardmask layer over the semiconductor substrate on a back side of the substrate.

In yet another embodiment, the method includes forming an interfacial layer over a semiconductor substrate on a front side of the substrate; forming a high-k dielectric layer and a capping layer over the interfacial layer; forming a metal layer over the high-k and capping layers; forming a polysilicon layer over the metal layer; and forming a dielectric layer over the semiconductor substrate on a back side of the substrate, the dielectric layer having a thickness less than about 80 angstrom (A).

In yet another embodiment, the method includes forming an interfacial layer over a semiconductor substrate on a front side of the substrate; forming a high-k dielectric layer over the interfacial layer; forming a capping layer over the high-k dielectric layer; and forming a metal layer over the capping layer. After forming the metal layer, the method includes forming a polysilicon layer over the metal layer and forming a dielectric layer over the semiconductor substrate on a back side of the substrate.

In yet another embodiment, the method includes forming an interfacial layer over a semiconductor substrate on a front side of the substrate; forming a high-k dielectric layer over the interfacial layer; forming a capping layer over the high-k dielectric layer; forming a metal layer over the capping layer; forming a polysilicon layer over the metal layer; forming a hardmask layer over the polysilicon layer. The method further includes forming a dielectric layer over the semiconductor substrate on a back side of the substrate after forming the metal layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Prior to present invention, problems have arisen when attempting to integrate high-k/metal gate features into a CMOS process flow, especially when the same tools are utilized for forming both wafers containing high-k/metal gate features and wafers that do not contain high-k/metal gate features. In that regard, the high-k/metal gate features can contaminate the tools of the production line resulting in defects in both high-k/metal gate wafers and non-high-k/metal gate wafers. For example, particles from the backside of the high-k/metal gate wafers can contaminate the tools of the production line in some instances. Accordingly, in some instances separate tools are dedicated to the wafers containing high-k/metal gate features. In some instances, the backside of the high-k/metal gate wafers are subjected to one or more cleaning procedures. However, even with backside cleaning processes the high-k/metal gate wafers often have defects, such as rim and bevel defects, that become the source of particles that contaminate the tools of the production line. This contamination can result in defects in all of the wafers produced on the production line, including both high-k/metal gate and non-high-k/metal gate wafers. The defects, in turn, cause the performance characteristics of both the high-k/metal gate wafers and the non-high-k/metal gate wafers to be adversely affected. Embodiments of the present disclosure address these and other problems and allow wafers containing high-k/metal gate features and wafers that do not contain high-k/metal gate features to be produced on the same production line with the same tools without the high-k/metal gate features contaminating the tools or adversely affecting the characteristics of the wafers produced on the production line.

Figure 1:
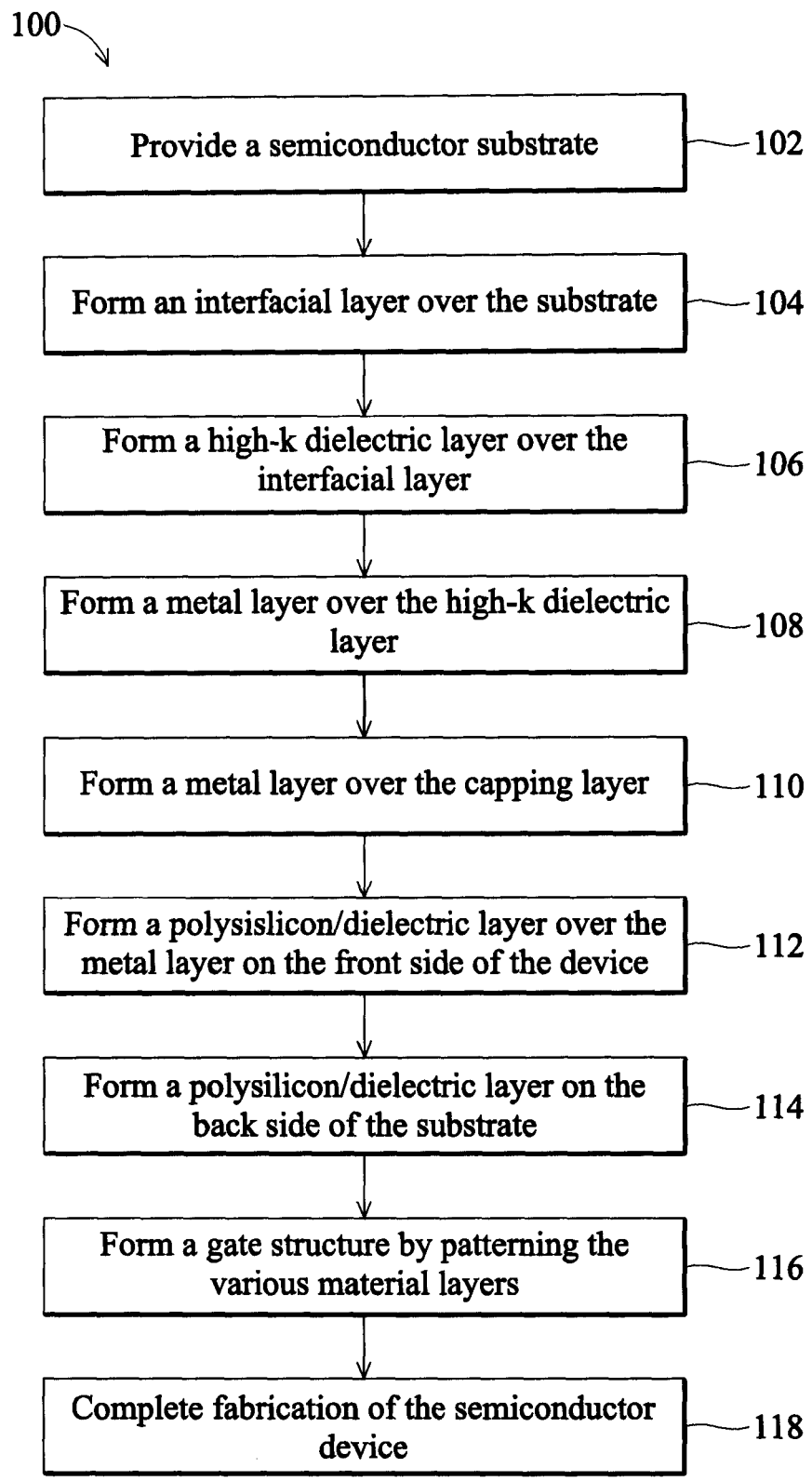
FIG. 1 is a flow chart illustrating a method for fabricating a semiconductor device in a high-k metal gate process according to one embodiment of the present disclosure.

Referring to FIG. 1, illustrated therein is a flowchart of a method 100 for fabricating a semiconductor device having a high-k dielectric and metal gate according to one embodiment of the present disclosure. Referring also to FIGS. 2-8, illustrated therein are cross-sectional views of a semiconductor device 200 at various stages of fabrication according to the method 100. It is understood that in some instances the semiconductor device 200 includes additional and/or different features than those shown in FIGS. 2-8. Semiconductor device 200 has been simplified in FIGS. 2-8 to illustrate gate structures of a PMOS device and NMOS device for a better understanding of the inventive concepts of the present disclosure. Further, it should be noted that all or part of the method 100 may be implemented within a CMOS process flow. Accordingly, it is understood that additional and/or alternative processes may be performed before, during, and/or after the steps of method 100.

Figure 2:
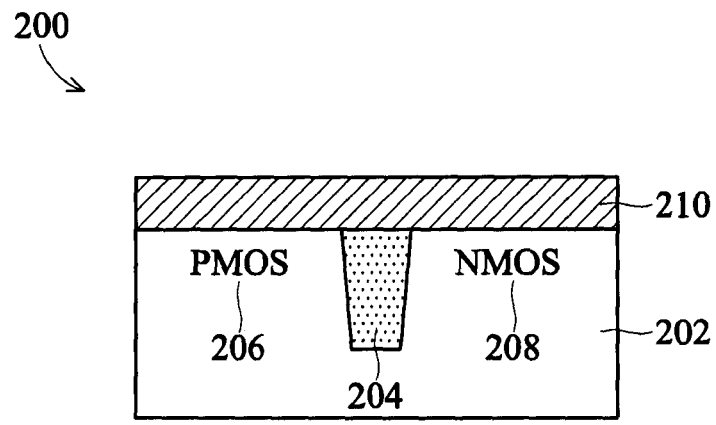
FIG. 2 is a cross-sectional view of at least a front side of semiconductor device at a first stage of fabrication in accordance with the method of FIG. 1.

Referring to FIG. 1, the method 100 begins with step 102 in which a semiconductor substrate is provided. As shown in FIG. 2, the semiconductor device 200 includes a semiconductor substrate 202, which in some embodiments is a silicon substrate. The substrate 202 may alternatively include silicon germanium, gallium arsenic, or other suitable semiconductor materials. The substrate 202 may further include other features such as various doped regions such as a p-well or n-well, a buried layer, and/or an epitaxy layer. Furthermore, the substrate 202 may be a semiconductor on insulator such as silicon-on-insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 may further include an isolation structure 204 such as shallow trench isolation (STI) or local oxidation of silicon (LOCOS) including the isolation feature may be formed in the substrate to define and electrically isolate active regions 206 and 208. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride. In the illustrated embodiment, active region 206 is configured for a PMOS device and active region 208 is configured for an NMOS device.

Referring again to FIG. 1, the method 100 continues with step 104 in which an interfacial layer is formed on the semiconductor substrate. As shown in FIG. 2, the semiconductor device 200 includes an interfacial layer 210 formed on front side of the substrate 202. The interfacial layer 210 may include a silicon oxide ($SiO_2$) layer having a thickness ranging from about 3 to about 10 angstrom (A). The interfacial layer 210 may be formed by a thermal growth oxide process. Alternatively, the interfacial layer 210 may optionally be formed by atomic layer deposition (ALD), chemical vapor deposition (CVD), combinations thereof, or other suitable processes. In some embodiments, the interfacial layer 210 includes a silicon oxynitride (SiON) or a silicon nitride (SiN).

Figure 3:
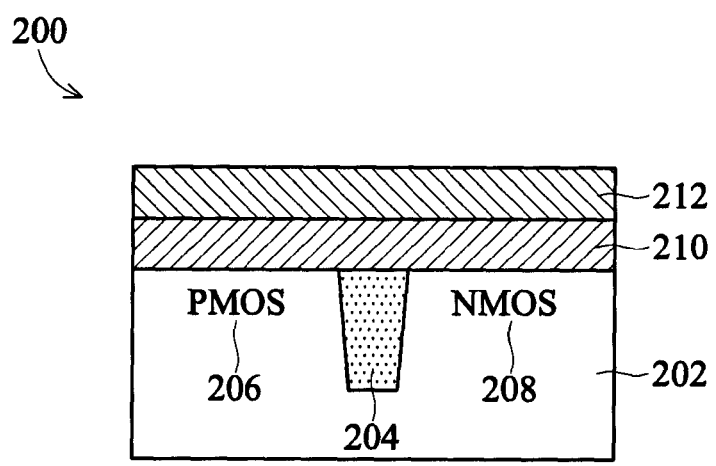
FIG. 3 is a cross-sectional view of at least the front side of the semiconductor device of FIG. 2 at a subsequent stage of fabrication in accordance with the method of FIG. 1.

Referring again to FIG. 1, the method 100 continues with step 106 in which a high-k dielectric layer is formed on the interfacial layer. As shown in FIG. 3, the semiconductor device 200 includes a high-k dielectric layer 212 formed on the interfacial layer 210 on the front side of the device. The high-k dielectric layer 212 may be formed by ALD, CVD, metal-organic CVD (MOCVD), physical vapor deposition (PVD or sputtering), combinations thereof, or other suitable deposition technique. Generally, the high-k dielectric layer 212 has a thickness ranging from about 5 to about 20 angstrom (A), but in some instances may have a thickness outside of this range. The high-k dielectric layer 212 may include a binary or ternary high-k film such as HfO, LaO, AlO, ZrO, TiO, $Ta_2O_5$, $Y_2O_3$, STO, BTO, BaZrO, HfZrO, HfLaO, HfTaO, HfTiO, combinations thereof, or other suitable materials. Alternatively, the high-k dielectric layer 212 may optionally include a silicate such as HfSiO, LaSiO, AlSiO, combinations thereof, or other suitable material.

Figure 4:
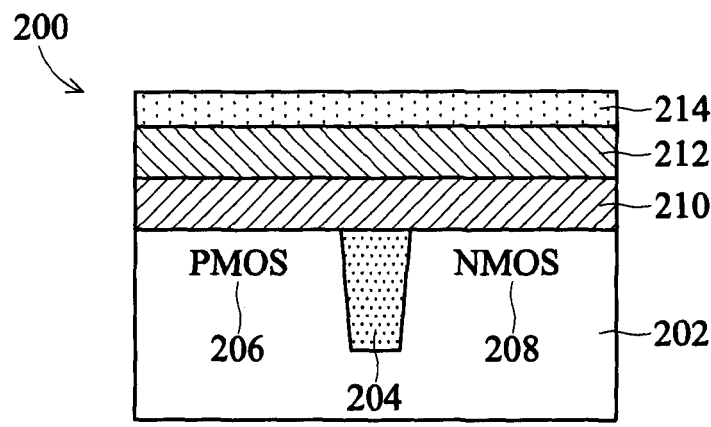
FIG. 4 is a cross-sectional view of at least the front side of the semiconductor device of FIGS. 2 and 3 at a subsequent stage of fabrication in accordance with the method of FIG. 1.

Referring again to FIG. 1, the method 100 continues with step 108 in which a capping layer is formed on the high-k dielectric layer. As shown in FIG. 4, the semiconductor device 200 includes a capping layer 214 on the front side of the device. In some instances, the capping layer is for tuning a work function of the gate electrode for properly performing as an NMOS transistor device and a PMOS transistor device, respectively. For example, the capping layer may include lanthanum oxide, LaSiO, manganese oxide, aluminum oxide, or other suitable materials. Though illustrated in FIG. 4 as being formed above the high-k dielectric layer 212, in other instances the capping layer 214 is formed underneath the high-k dielectric layer 212, which may require the capping layer 214 to be formed prior to the high-k dielectric layer 212. Generally, the capping layer 214 has a thickness ranging from about 3 to about 10 angstrom (A), but in some instances may have a thickness outside of this range. It should be noted that in some instances formation of the high-k dielectric layer 212 and formation of the capping layer 214 are performed in-situ.

Figure 5:
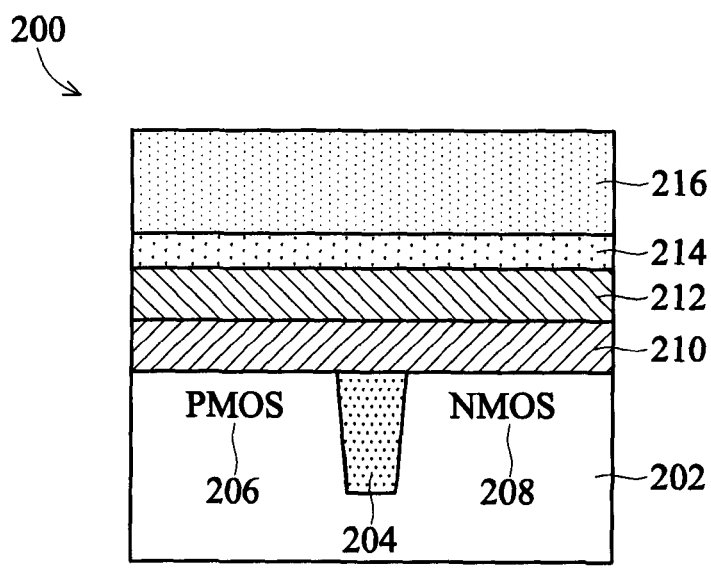
FIG. 5 is a cross-sectional view of at least the front side of the semiconductor device of FIGS. 2-4 at a subsequent stage of fabrication in accordance with the method of FIG. 1.

Referring again to FIG. 1, the method 100 continues with step 110 in which a metal layer is formed over the capping layer. As shown in FIG. 5, the semiconductor device 200 includes a metal layer formed 216 over the capping layer 214 on the front side of the device. Generally, the metal gate layer 216 has a thickness ranging from about 10 to about 500 angstrom (A), but in some instances has a thickness outside of this range. The metal gate layer 216 may be formed by various deposition techniques such as CVD, physical vapor deposition (PVD or sputtering), plating, or other suitable techniques. In some instances, the metal gate layer 216 includes TiN, TaN, $ZrSi_2$, $MoSi_2$, $TaSi_2$, $NiSi_2$, WN, combinations thereof, or other suitable materials.

Figure 6:
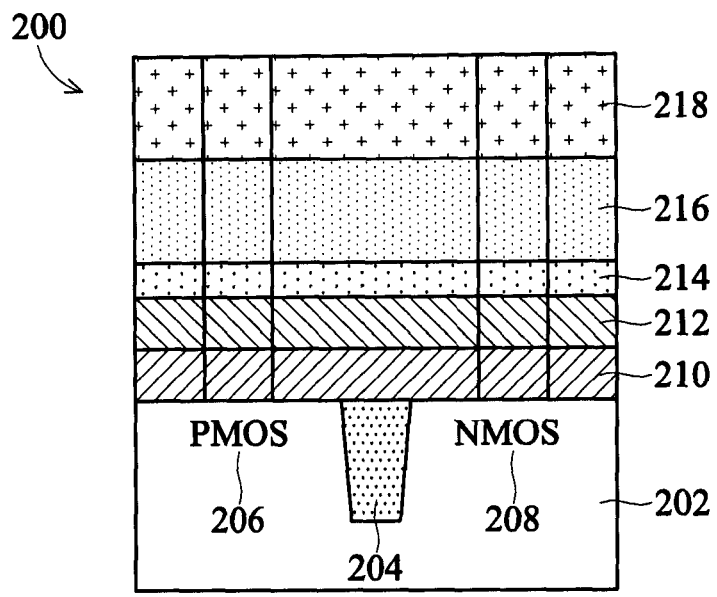
FIG. 6 is a cross-sectional view of at least the front side of the semiconductor device of FIGS. 2-5 at a subsequent stage of fabrication in accordance with the method of FIG. 1.

Referring again to FIG. 1, the method 100 continues with step 112 in which a polysilicon layer is formed over the metal layer on the front side of the device. As shown in FIG. 6, the semiconductor device 200 includes a polysilicon layer 218 over the metal layer 216 on the front side of the device. The poly layer 218 is formed on the metal gate layer 216 by deposition or other suitable process. In some instances, the poly layer 218 is deposited using a CVD tool. In other instances, the poly layer 218 is deposited using a furnace tool. Generally, the poly layer 218 may have any desired thickness and in some embodiments has a thickness between about 200 and about 2000 angstrom (A).

Figure 7:
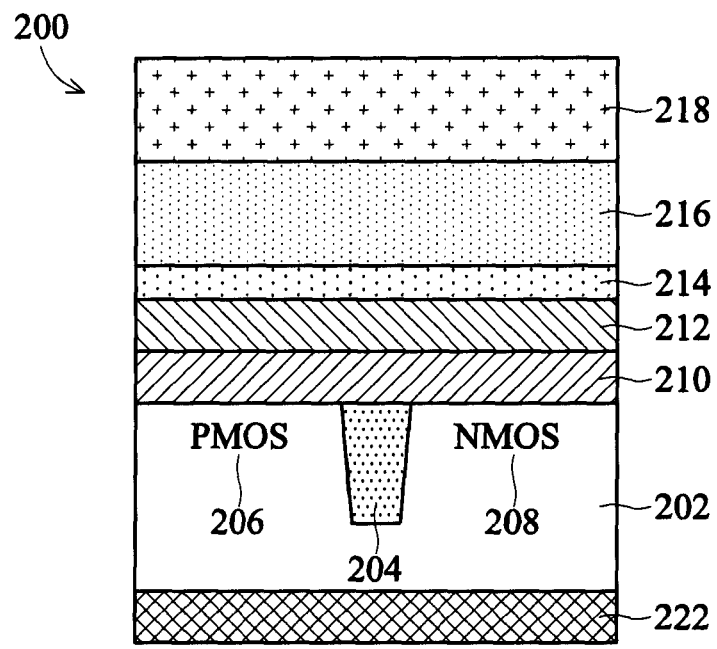
FIG. 7 is a cross-sectional view of the front side and a back side of the semiconductor device of FIGS. 2-6 at a subsequent stage of fabrication in accordance with the method of FIG. 1.

Referring again to FIG. 1, the method 100 continues with step 114 in which a polysilicon layer is formed on the back side of the device. As shown in FIG. 7, the semiconductor device 200 includes a polysilicon layer 222 on the back side of the substrate 202. The poly layer 222 is formed by deposition or other suitable process. In some instances, the poly layer 222 is deposited using a CVD tool. In other instances, the poly layer 222 is deposited using a furnace tool. For example, in some embodiments the poly layer 222 is deposited at a pressure between about 0.1 and about 100 Torr, a temperature between about 400 and about 800 degrees Celsius, with $SiH_4$ at a flow rate between about 0.1 and about 100 standard cubic centimeters per minute (sccm), with a thickness between about 50 and about 1000 angstrom (A). In some instances, the poly layer 222 has a thickness outside of this range. In some instances, the poly layers 218 and 222 are formed simultaneously on the front side and back side of the device 200. In that regard, the poly layers 218 and 222 are formed by the same deposition process in some instances. In other embodiments, the poly layers 218 and 222 are formed separately with the same or different deposition or other processes. The poly layer 222 prevents particles, such as particles from the previously deposited high-k and metal layers, that have ended up on the back side of the substrate 202 from contaminating subsequent tools of the CMOS process and/or non-high-k/metal gate wafers. Specifically, the poly layer 222 seals any of these particles within and/or between the substrate 202 and the poly layer 222. Accordingly, by depositing the poly layer 222 on the back side of the device, wafers with high-k/metal gate features may be manufactured on the same production line and with the same tools as non-high-k/metal gate wafers without fear of contamination.

Figure 8:
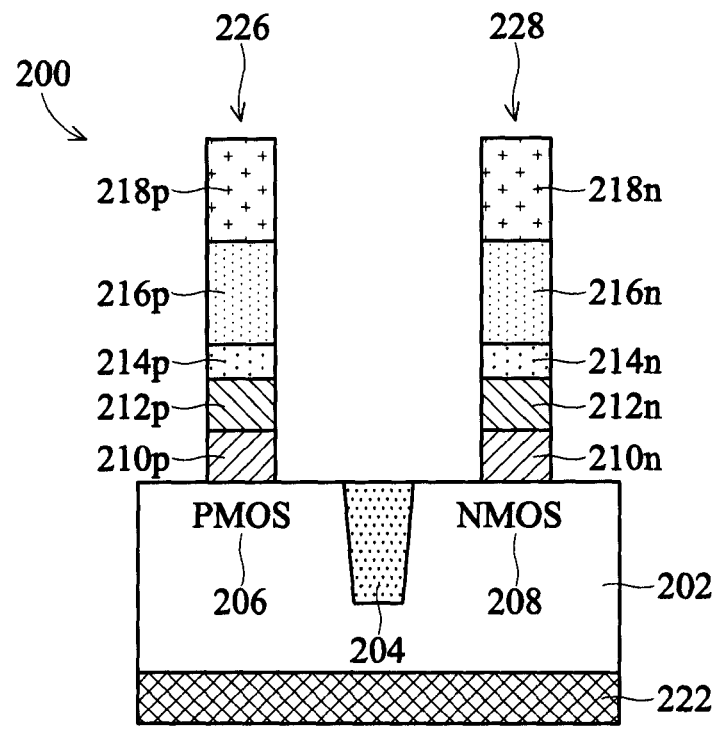
FIG. 8 is a cross-sectional view of the front side and the back side of the semiconductor device of FIGS. 2-7 at a subsequent stage of fabrication in accordance with the method of FIG. 1.

Referring again to FIG. 1, the method 100 continues with step 116 in which a gate structure is formed by patterning the various layers. As shown in FIG. 8, a gate stack 226 in the PMOS device 206 and a gate stack 228 in the NMOS device 208 are formed by a dry etch process, a wet etch process, or a combination of dry and wet etch processes. The gate stack 226 includes an interfacial layer 210p, high-k dielectric layer 212p, capping layer 214p, metal layer 216p, and poly layer 218p. The gate stack 228 includes an interfacial layer 210n, high-k dielectric layer 212n, capping layer 214n, metal layer 216n, and poly layer 218n. It is understood that the metal layers 216p and 216n may be configured so as to properly perform as a gate electrodes for the PMOS device 206 and the NMOS device 208, respectively. Generally, the patterning of the gate structure is performed in any suitable manner. In one embodiment, a layer of photoresist is formed on the poly layer by a suitable process, such as spin-on coating, and then patterned to form a patterned photoresist feature by a proper lithography patterning method. The pattern of the photoresist layer can then be transferred by a dry or wet etching process to the underlying poly layer 218, metal layer 216, capping layer 214, high-k dielectric layer 212, and interfacial layer 210 in a plurality of processing steps and various proper sequences. The photoresist layer may be stripped thereafter by a suitable process known in the art. In another embodiment, a hard mask layer is used. The patterned photoresist layer is formed on the hard mask layer. The pattern of the photoresist layer is transferred to the hard mask layer and then transferred to the underlying material layers to form the gate structures. The hard mask layer may include silicon nitride, silicon oxynitride, silicon carbide, and/or other suitable dielectric materials, and may be formed using a method such as CVD or PVD.

Referring again to FIG. 1, the method 100 continues with step 118 in which fabrication of the semiconductor device is completed. In some instances a CMOS process flow is performed to complete fabrication of the semiconductor device. It is understood the semiconductor device 200 may continue with CMOS process flow to form various structures such as lightly doped drain regions (LDD), sidewall or gate spacers on the gate stacks, source/drain regions, silicide features, contact/vias, interconnect layers, metal layers, interlayer dielectric, passivation layer and so forth. For example, light doped source/drain regions may be formed in the substrate 202 and aligned (self aligned) with the gate stacks 226, 228 by an ion implantation process. The lightly doped regions of a P-type (P-type dopant such as boron) may be formed on either side of the gate stack 226 in the PMOS device 206 as in known in the art. The lightly doped regions of an N-type (N-type dopant such as phosphorous or arsenic) may be formed on either side of the gate stack 228 in the NMOS device 208 as is known in the art. In another example, sidewall or gate spacers may be formed on both sidewalls of the gate stacks 226, 228. The sidewall spacers include a dielectric material such as silicon oxide in some instances. Alternatively, the sidewall spacers optionally include silicon nitride, silicon carbide, silicon oxynitride, or combinations thereof. In some embodiments, the sidewall spacers have a multilayer structure. In some instances, the sidewall spacers are formed by a deposition and etching (anisotropic etching technique) as is known in the art.

Figure 9:
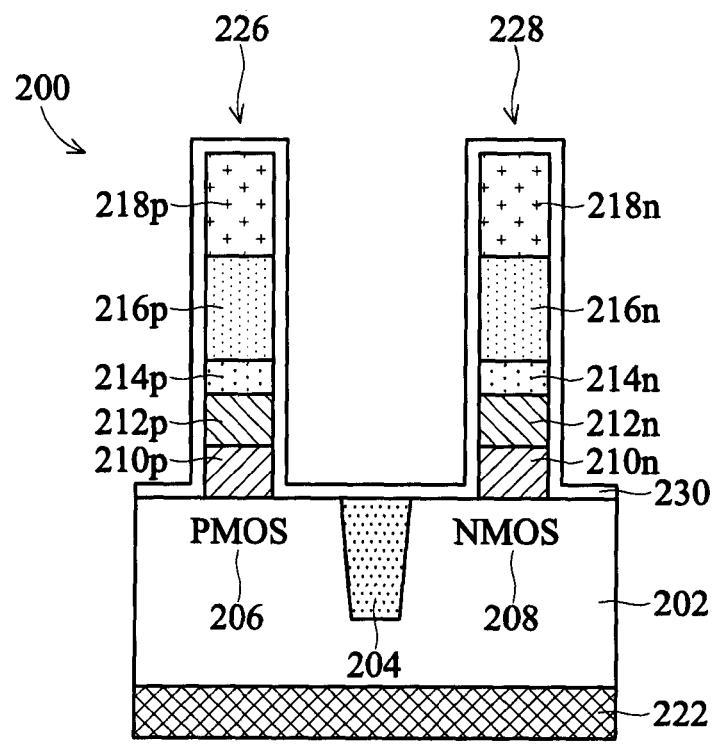
FIG. 9 is a cross-sectional view of the front side and the back side of the semiconductor device of FIGS. 2-8 at a subsequent stage of fabrication in accordance with one embodiment of the present disclosure.

Referring now to FIG. 9, shown therein is the semiconductor device 200 at a subsequent stage of fabrication according to one embodiment of the present disclosure. In particular, the device 200 is shown with a dielectric layer 230 covering the front side of the device. Generally, the dielectric layer 230 has a thickness less than about 80 angstrom (A), but in some instances may have a greater thickness. The dielectric layer 230 is formed of silicon-oxide, silicon-nitride, silicon-oxynitride, or other suitable dielectric materials. Similar to the poly layer 222, the dielectric layer 230 prevents particles, such as particles from the high-k and metal layers 212 and 216, from contaminating subsequent tools of the CMOS process and/or non-high-k/metal gate wafers.

Figure 10:
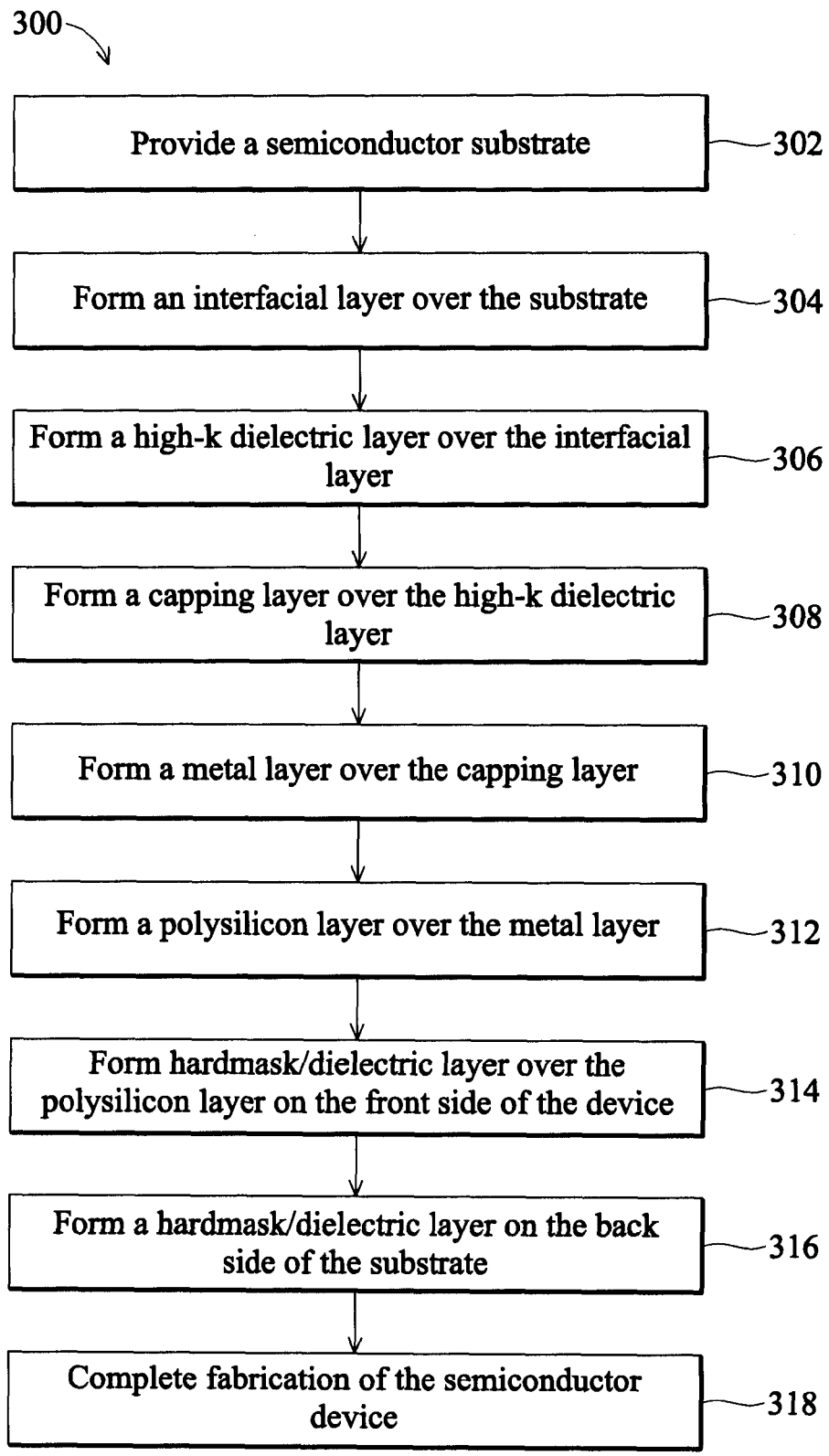
FIG. 10 is a flow chart illustrating a method for fabricating a semiconductor device in a high-k metal gate process according to one embodiment of the present disclosure.

Referring to FIG. 10, illustrated therein is a flowchart of a method 300 for fabricating a semiconductor device having a high-k dielectric and metal gate according to another embodiment of the present disclosure. Referring also to FIGS. 11-17, illustrated therein are cross-sectional views of a semiconductor device 400 at various stages of fabrication according to the method 300. It is understood that in some instances the semiconductor device 400 includes additional and/or different features than those shown in FIGS. 11-17. Semiconductor device 400 has been simplified in FIGS. 11-17 to illustrate gate structures of a PMOS device and NMOS device for a better understanding of the inventive concepts of the present disclosure. Further, it should be noted that all or part of the method 300 may be implemented within a CMOS process flow. Accordingly, it is understood that additional and/or alternative processes may be performed before, during, and/or after the steps of method 300.

Figure 11:
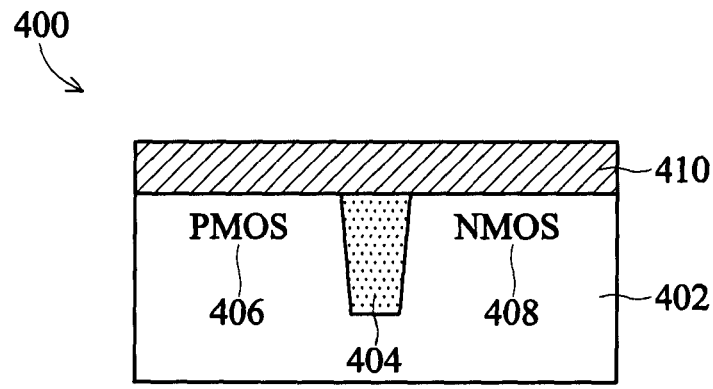
FIG. 11 is a cross-sectional view of at least a front side of a semiconductor device at a first stage of fabrication in accordance with the method of FIG. 10.

Referring to FIG. 10, the method 300 begins with step 302 in which a semiconductor substrate is provided. As shown in FIG. 11, the semiconductor device 400 includes a semiconductor substrate 402, which in some embodiments is a silicon substrate. The substrate 402 may alternatively include silicon germanium, gallium arsenic, or other suitable semiconductor materials. The substrate 402 may further include other features such as various doped regions such as a p-well or n-well, a buried layer, and/or an epitaxy layer. Furthermore, the substrate 402 may be a semiconductor on insulator such as silicon-on-insulator (SOI). In other embodiments, the semiconductor substrate 402 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 400 may further include an isolation structure 404 such as shallow trench isolation (STI) or local oxidation of silicon (LOCOS) including the isolation feature may be formed in the substrate to define and electrically isolate active regions 406 and 408. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride. In the illustrated embodiment, active region 406 is configured for a PMOS device and active region 408 is configured for an NMOS device.

Referring again to FIG. 10, the method 300 continues with step 304 in which an interfacial layer is formed on the semiconductor substrate. As shown in FIG. 11, the semiconductor device 400 includes an interfacial layer 410 formed on front side of the substrate 402. The interfacial layer 410 may include a silicon oxide ($SiO_2$) layer having a thickness ranging from about 3 to about 10 angstrom (A). The interfacial layer 410 may be formed by a thermal growth oxide process. Alternatively, the interfacial layer 410 may optionally be formed by atomic layer deposition (ALD), chemical vapor deposition (CVD), combinations thereof, or other suitable processes. In some embodiments, the interfacial layer 410 includes silicon oxynitride (SiON) or silicon nitride (SiN).

Figure 12:
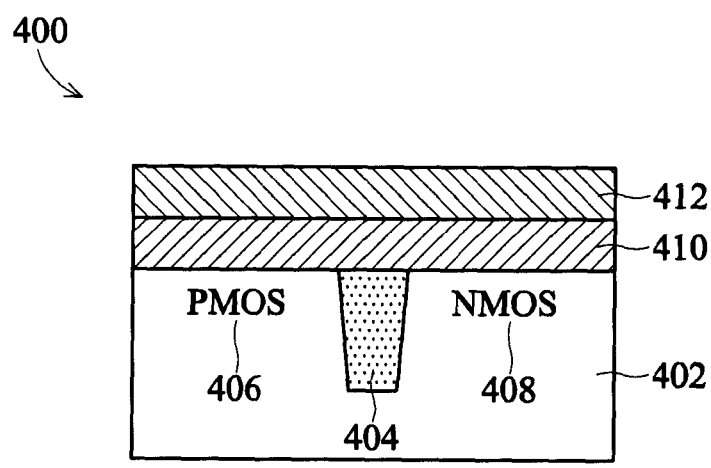
FIG. 12 is a cross-sectional view of at least the front side of the semiconductor device of FIG. 11 at a subsequent stage of fabrication in accordance with the method of FIG. 10.

Referring again to FIG. 10, the method 300 continues with step 306 in which a high-k dielectric layer is formed on the interfacial layer. As shown in FIG. 12, the semiconductor device 400 includes a high-k dielectric layer 412 formed on the interfacial layer 410 on the front side of the device. The high-k dielectric layer 412 may be formed by ALD, CVD, metal-organic CVD (MOCVD), physical vapor deposition (PVD or sputtering), combinations thereof, or other suitable deposition technique. Generally, the high-k dielectric layer 412 has a thickness ranging from about 5 to about 20 angstrom (A), but in some instances may have a thickness outside of this range. The high-k dielectric layer 412 may include a binary or ternary high-k film such as HfO, LaO, AlO, ZrO, TiO, $Ta_2O_5$, $Y_2O_3$, STO, BTO, BaZrO, HfZrO, HfLaO, HfTaO, HfTiO, combinations thereof, or other suitable materials. Alternatively, the high-k dielectric layer 412 may optionally include a silicate such as HfSiO, LaSiO, AlSiO, combinations thereof, or other suitable material.

Figure 13:
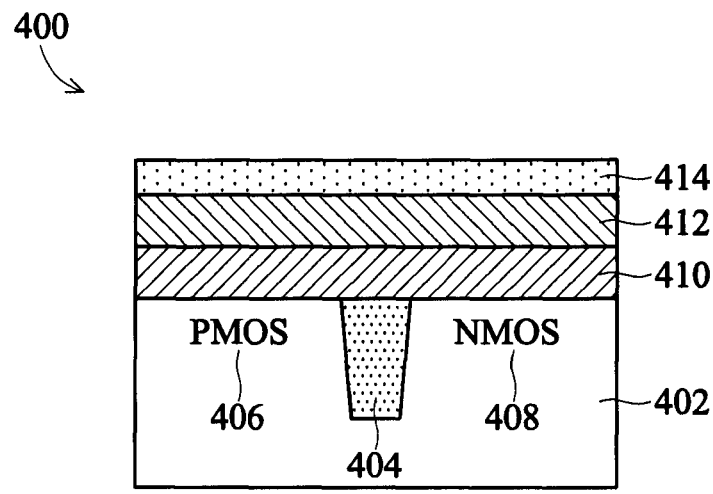
FIG. 13 is a cross-sectional view of at least the front side of the semiconductor device of FIGS. 11 and 12 at a subsequent stage of fabrication in accordance with the method of FIG. 10.

Referring again to FIG. 10, the method 300 continues with step 308 in which a capping layer is formed on the high-k dielectric layer. As shown in FIG. 13, the semiconductor device 400 includes a capping layer 414 on the front side of the device. In some instances, the capping layer 414 is for tuning a work function of the gate electrode for properly performing as an NMOS transistor device and a PMOS transistor device, respectively. For example, the capping layer 414 may include lanthanum oxide, LaSiO, manganese oxide, aluminum oxide, or other suitable materials. Though illustrated in FIG. 13 as being formed above the high-k dielectric layer 412, in other instances the capping layer 414 is formed underneath the high-k dielectric layer 412, which may require the capping layer 414 to be formed prior to the high-k dielectric layer 412. Generally, the capping layer 414 has a thickness ranging from about 3 to about 10 angstrom (A), but in some instances may have a thickness outside of this range. It should be noted that in some instances formation of the high-k dielectric layer 412 and formation of the capping layer 414 are performed in-situ.

Figure 14:
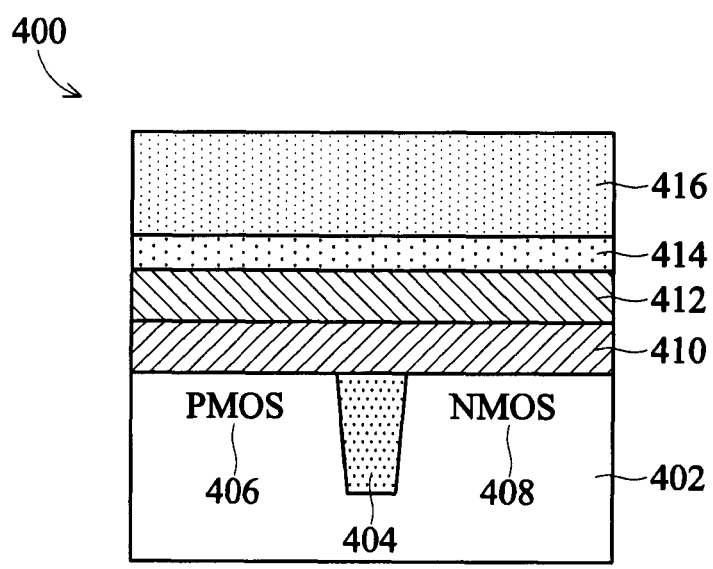
FIG. 14 is a cross-sectional view of at least the front side of the semiconductor device of FIGS. 11-13 at a subsequent stage of fabrication in accordance with the method of FIG. 10.

Referring again to FIG. 10, the method 300 continues with step 310 in which a metal layer is formed over the capping layer. As shown in FIG. 14, the semiconductor device 400 includes a metal layer formed 416 over the capping layer 414 on the front side of the device. Generally, the metal gate layer 416 has a thickness ranging from about 10 to about 500 angstrom (A), but in some instances has a thickness outside of this range. The metal gate layer 416 may be formed by various deposition techniques such as CVD, physical vapor deposition (PVD or sputtering), plating, or other suitable techniques. In some instances, the metal gate layer 416 includes TiN, TaN, $ZrSi_2$, $MoSi_2$, $TaSi_2$, $NiSi_2$, WN, combinations thereof, or other suitable materials.

Figure 15:
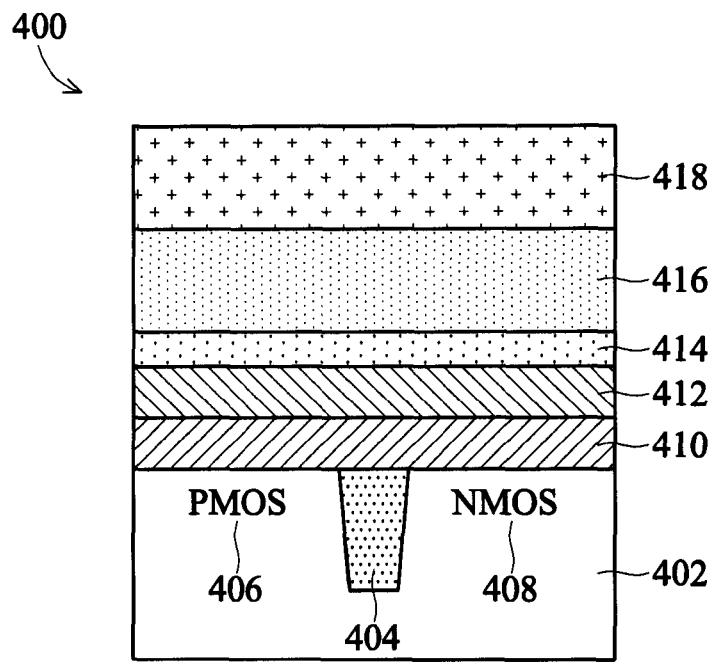
FIG. 15 is a cross-sectional view of at least the front side of the semiconductor device of FIGS. 11-14 at a subsequent stage of fabrication in accordance with the method of FIG. 10.

Referring again to FIG. 10, the method 300 continues with step 312 in which a polysilicon layer is formed over the metal layer on the front side of the device. As shown in FIG. 15, the semiconductor device 400 includes a polysilicon layer 418 over the metal layer 416 on the front side of the device. The poly layer 418 is formed on the metal gate layer 416 by deposition or other suitable process. In some instances, the poly layer 418 is deposited using a CVD tool. In other instances, the poly layer 418 is deposited using a furnace tool. Generally, the poly layer 418 may have any desired thickness and in some embodiments has a thickness between about 200 and about 2000 angstrom (A).

Figure 16:
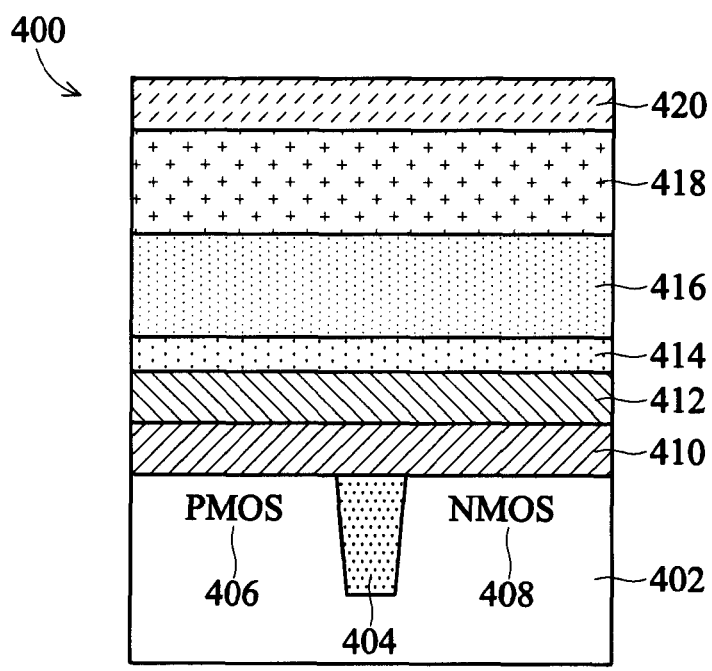
FIG. 16 is a cross-sectional view of at least the front side of the semiconductor device of FIGS. 11-15 at a subsequent stage of fabrication in accordance with the method of FIG. 10.

Referring again to FIG. 10, the method 300 continues with step 314 in which a hardmask layer is formed on the front side of the device. As shown in FIG. 16, the semiconductor device 400 includes a hardmask layer 420 over the poly layer 418 on the front side of the device. The hardmask layer 420 is formed by thermal deposition or other suitable process. The hardmask layer 420 is formed of silicon-oxide, silicon-nitride, silicon-oxynitride, silicon carbide, and/or other suitable dielectric materials. Generally, the hardmask layer 420 may have any desired thickness and in some embodiments has a thickness between about 10 angstrom and about 200 angstrom (A).

Figure 17:
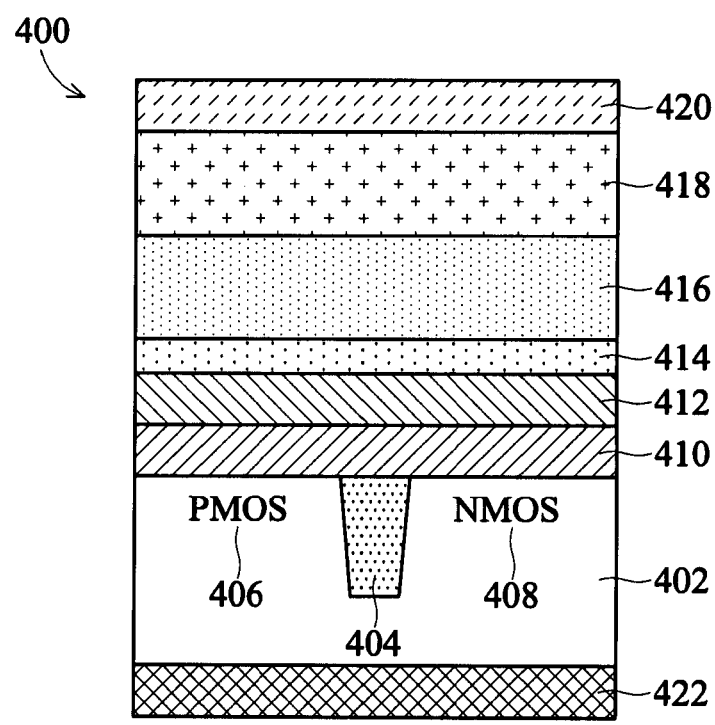
FIG. 17 is a cross-sectional view of the front side and a back side of the semiconductor device of FIGS. 11-16 at a subsequent stage of fabrication in accordance with the method of FIG. 10.

Referring again to FIG. 10, the method 300 continues with step 316 in which a hardmask layer is formed on the back side of the device. As shown in FIG. 17, the semiconductor device 400 includes a hardmask layer 422 on the back side of the substrate 402. The hardmask layer 422 is formed by thermal deposition or other suitable process. In some instances, a silicon-oxide hardmask layer is formed using a thermal deposition at a pressure between about 0.1 and about 100 Torr, a temperature between about 400 and about 800 degrees Celcius, with tetraethyl orthosilicate (TEOS) at a flow rate between about 0.1 and about 100 sccm, with a thickness between about 50 and about 1000 angstrom (A). In some instances, the silicon-oxide hardmask layer has a thickness outside of this range. In some instances, a silicon-nitride hardmask layer is formed using a thermal deposition at a pressure between about 0.1 and about 100 Torr, a temperature between about 400 and about 800 degrees Celcius, with HCD or BTBAS at a flow rate between about 0.1 and about 100 sccm, with a thickness between about 50 and about 100 angstrom (A). In some instances, the silicon-nitride hardmask layer has a thickness outside of this range. In some instances, the hardmask layers 420 and 422 are formed simultaneously on the front side and back side of the device 400. In that regard, the hardmask layers 420 and 422 are formed by the same deposition process in some instances. In other embodiments, the hardmask layers 420 and 422 are formed separately with the same or different deposition or formation processes. The hardmask layer 422 prevents particles, such as particles from the previously deposited high-k and metal layers, that have ended up on the back side of the substrate 402 from contaminating subsequent tools of the CMOS process and/or non-high-k/metal gate wafers. Specifically, the hardmask layer 422 seals any of these particles within and/or between the substrate 402 and the hardmask layer 422. Accordingly, by depositing the hardmask layer 422 on the back side of the device, wafers with high-k/metal gate features may be manufactured on the same production line and with the same tools as non-high-k/metal gate wafers without fear of contamination.

Referring again to FIG. 10, the method 300 continues with step 318 in which fabrication of the semiconductor device is completed. In some instances a CMOS process flow is performed to complete fabrication of the semiconductor device. It is understood the semiconductor device 200 may continue with CMOS process flow to form various structures such as gate structures, gate stacks, lightly doped drain regions (LDD), sidewall or gate spacers on the gate stacks, source/drain regions, silicide features, contact/vias, interconnect layers, metal layers, interlayer dielectric, passivation layer and so forth.

The present disclosure provides a method of fabricating a semiconductor device comprising forming an interfacial layer over a semiconductor substrate on a front side of the substrate; forming a high-k dielectric layer over the interfacial layer; forming a capping layer over the high-k dielectric layer; forming a metal layer over the capping layer; forming a first polysilicon layer over the metal layer; and forming a second polysilicon layer over the semiconductor substrate on the back side of the substrate. The second polysilicon layer is formed using a chemical vaporization deposition (CVD) tool in some instances. In other instances the second polysilicon layer is formed using a furnace. In some instances, the second polysilicon layer is formed with a pressure between about 0.1 and about 100 Torr; a temperature between about 400 and about 800 degrees Celsius; and silane ($SiH_4$) at a flow rate between about 0.1 and about 100 sccm. The second polysilicon layer is formed with a thickness between about 50 and about 1000 angstrom (A) in some embodiments. In some instances, the first and second polysilicon layers are formed simultaneously. Further, in some instances the first polysilicon layer is formed with a first deposition process and the second polysilicon layer is formed with a second deposition process having at least one parameter different than the first deposition process.

The present disclosure also provides a method of fabricating a semiconductor device comprising forming an interfacial layer over a semiconductor substrate on a front side of the substrate; forming a high-k dielectric layer over the interfacial layer; forming a capping layer over the high-k dielectric layer; forming a metal layer over the capping layer; forming a polysilicon layer over the metal layer; forming a first hardmask layer over the polysilicon layer; and forming a second hardmask layer over the semiconductor substrate on the back side of the substrate. In some instances the second hardmask layer comprises a silicon-oxide layer. In one embodiment, the silicon-oxide layer is formed using thermal deposition with a pressure between about 0.1 and about 100 Torr; a temperature between about 400 and about 800 degrees Celsius; and tetraethyl orthosilicate (TEOS) at a flow rate between about 0.1 and about 100 sccm. In some instances the second hardmask layer comprises forming a silicon-nitride layer. In one embodiment, the silicon-nitride layer is formed using thermal deposition with a pressure between about 0.1 and about 100 Torr; a temperature between about 400 and about 800 degrees Celsius; and hexachlorobenzene (HCB) or bis(tertiary-butylamino)silane (BTBAS) at a flow rate between about 0.1 and about 100 sccm. In some instances, the second hardmask layer comprises a dielectric layer. In some embodiments, the dielectric hardmask layer comprises a material selected from the group consisting of silicon-oxide, silicon-nitride, silicon-oxynitride, and silicon-carbide.

The present disclosure also provides a method of fabricating a semiconductor device comprising forming an interfacial layer over a semiconductor substrate on a front side of the substrate; forming a high-k dielectric layer and a capping layer over the interfacial layer; forming a metal layer over the high-k and capping layers; forming a polysilicon layer over the metal layer; and forming a dielectric layer over the semiconductor substrate on the back side of the substrate, the dielectric layer having a thickness less than about 80 angstrom (A). In some embodiments, the dielectric layer comprises a material selected from the group consisting of polysilicon, silicon-oxide, silicon-nitride, silicon-oxynitride, and silicon-carbide. In some instances, the method further comprises forming a hardmask layer over the polysilicon layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, it is understood that the semiconductor devices disclosed herein are not limited to a specific transistor and may include other devices such as a finFET transistor, a high voltage transistor, a bipolar junction transistor (BJT), resistor, diode, capacitor, and eFuse.

What is claimed is:

1. A method of fabricating a semiconductor device comprising:
    forming an interfacial layer over a semiconductor substrate on a front side of the substrate;
    forming a high-k dielectric layer and a capping layer over the interfacial layer;
    forming a metal layer over the high-k and capping layers;
    forming a polysilicon layer over the metal layer; and
    after forming the polysilicon layer, forming a dielectric layer over the semiconductor substrate on a back side of the substrate, the dielectric layer having a thickness less than about 80 angstrom (A).

2. The method of claim 1, wherein the dielectric layer comprises a material selected from the group consisting of silicon-oxide, silicon-nitride, silicon-oxynitride, and silicon-carbide.

3. The method of claim 2, further comprising forming a second dielectric layer over the polysilicon layer, wherein the second dielectric layer is formed concurrently with the dielectric layer formed over the back side of the substrate.

4. A method of fabricating a semiconductor device comprising:
    forming gate dielectric layer and a metal layer over a semiconductor substrate on a front side of the semiconductor substrate;
    after forming the metal layer, forming a polysilicon layer over the metal layer;
    after forming the metal layer, forming a dielectric layer over the semiconductor substrate on a back side of the semiconductor substrate; and
    after forming the dielectric layer, patterning the gate dielectric layer, the metal layer and the polysilicon layer to form a gate structure.

5. The method of claim 4, wherein the dielectric layer having a thickness less than about 80 angstrom (A).

6. The method of claim 4, wherein the dielectric layer includes silicon.

7. The method of claim 4, further comprising forming a hardmask layer over the polysilicon layer, wherein the hardmask is formed concurrently with the dielectric layer.

8. The method of claim 7, wherein the hardmask includes silicon.

9. A method of fabricating a semiconductor device comprising:
    forming a high-k dielectric layer over a front side of a semiconductor substrate;
    forming a metal layer over the high-k dielectric layer;
    forming a polysilicon layer over the metal layer;
    forming a first dielectric layer over the polysilicon layer; and
    after forming the metal layer, forming a second dielectric layer over the semiconductor substrate on a back side of the substrate.

10. The method of claim 9, wherein forming the second dielectric layer comprises forming a silicon-oxide layer.

11. The method of claim 10, wherein forming the silicon-oxide layer comprises utilizing thermal deposition with:
    a pressure between about 0.1 and about 100 Torr;
    a temperature between about 400 and about 800 degrees Celsius; and
    tetraethyl orthosilicate (TEOS) at a flow rate between about 0.1 and about 100 standard cubic centimeters per minute (sccm).

12. The method of claim 9, wherein the silicon-oxide layer is formed with a thickness between about 50 and about 1000 angstrom (A).

13. The method of claim 9, wherein forming the second dielectric layer comprises forming a silicon-nitride layer.

14. The method of claim 13, wherein forming the silicon-nitride layer comprises utilizing thermal deposition with:
    a pressure between about 0.1 and about 100 Torr;
    a temperature between about 400 and about 800 degrees Celsius; and
    hexachlorobenzene (HCB) or bis(tertiary-butylamino)silane (BTBAS) at a flow rate between about 0.1 and about 100 standard cubic centimeters per minute (sccm).

15. The method of claim 13, wherein the silicon-nitride layer is formed with a thickness between about 50 and about 1000 angstrom (A).

16. The method of claim 9, wherein the first dielectric layer and the second dielectric layer are formed concurrently.

17. The method of claim 9, further comprising:
after forming the second dielectric layer, patterning the high-k dielectric layer, the metal layer, the polysilicon layer, and the first dielectric layer to form a gate stack.

18. The method of claim 17, further comprising:
forming a third dielectric layer over a top surface and sidewalls of the gate stack.

19. The method of claim 1, further comprising:
forming a hard mask layer on the polysilicon layer, wherein the hard mask layer is formed substantially simultaneously with the forming the dielectric layer over the back side of the substrate.

20. The method of claim 4, further comprising:
forming a second dielectric layer as a conformal coating over the gate structure.

* * * * *